(12) United States Patent
Willer et al.

(10) Patent No.: US 6,661,053 B2
(45) Date of Patent: Dec. 9, 2003

(54) MEMORY CELL WITH TRENCH TRANSISTOR

(75) Inventors: Josef Willer, Riemerling (DE); Frank Lau, Bad Aibling (DE); Dezsö Takacs, München (DE)

(73) Assignee: Infineon Technologies AG, Munich (DE)

( * ) Notice: Subject to any disclaimer, the term of this patent is extended or adjusted under 35 U.S.C. 154(b) by 6 days.

(21) Appl. No.: 10/022,654

(22) Filed: Dec. 18, 2001

(65) Prior Publication Data

US 2003/0111687 A1 Jun. 19, 2003

(51) Int. Cl.⁷ .................................. H01L 29/76
(52) U.S. Cl. ................... 257/329; 257/329; 257/330
(58) Field of Search ............................. 257/329, 316, 257/315, 330, 335; 365/169; 438/429, 381

(56) References Cited

U.S. PATENT DOCUMENTS

| | | | |
|---|---|---|---|
| 5,146,426 A | * 9/1992 | Mukherjee et al. | ......... 365/149 |
| 5,229,312 A | 7/1993 | Mukherjee et al. | |
| 5,854,501 A | 12/1998 | Kao | |
| 5,888,880 A | * 3/1999 | Gardner et al. | ............. 438/424 |
| 5,990,515 A | * 11/1999 | Liu et al. | ................... 257/316 |
| 6,025,626 A | * 2/2000 | Tempel | ........................ 257/315 |
| 6,127,226 A | 10/2000 | Lin et al. | |
| 6,137,132 A | 10/2000 | Wu | |
| 6,410,397 B1 | * 6/2002 | Ochiai et al. | ................ 438/381 |
| 2002/0024092 A1 | * 2/2002 | Palm et al. | ................ 257/330 |

FOREIGN PATENT DOCUMENTS

| | | |
|---|---|---|
| DE | 196 39 026 C1 | 4/1998 |
| DE | 100 39 441 A1 | 2/2002 |
| EP | 0 967 654 A1 | 12/1999 |
| JP | 4 012 573 | 1/1992 |
| WO | 98/13878 | 4/1998 |

OTHER PUBLICATIONS

Junko Tanaka et al.: "A Sub–0.1–$\mu$m Grooved Gate MOSFET with High Immunity to Short–Channel Effects", *IEDM*, 1993, pp. 537–540.

* cited by examiner

Primary Examiner—David Nelms
Assistant Examiner—Thinh T. Nguyen
(74) Attorney, Agent, or Firm—Laurence A. Greenberg; Werner H. Stemer; Ralph E. Locher

(57) ABSTRACT

A memory cell includes a storage transistor having the following structure and being dimensioned to shorten program and erase times. A semiconductor body includes a top surface and a trench formed therein having walls joined by a curved bottom. A source zone in the semiconductor body is doped from the top surface. A drain zone in the semiconductor body is doped from the top surface. Junctions of the source and drain zones are beneath each. A gate electrode on the top surface of the semiconductor body is disposed between the source zone and the drain zone in the trench. A dielectric layer isolates the gate electrode from the semiconductor body and acts as a storage medium. Each of the junctions intersects a respective one of the walls at a respective depth from the bottom. A respective spacing across the trench is defined at each depth.

18 Claims, 3 Drawing Sheets

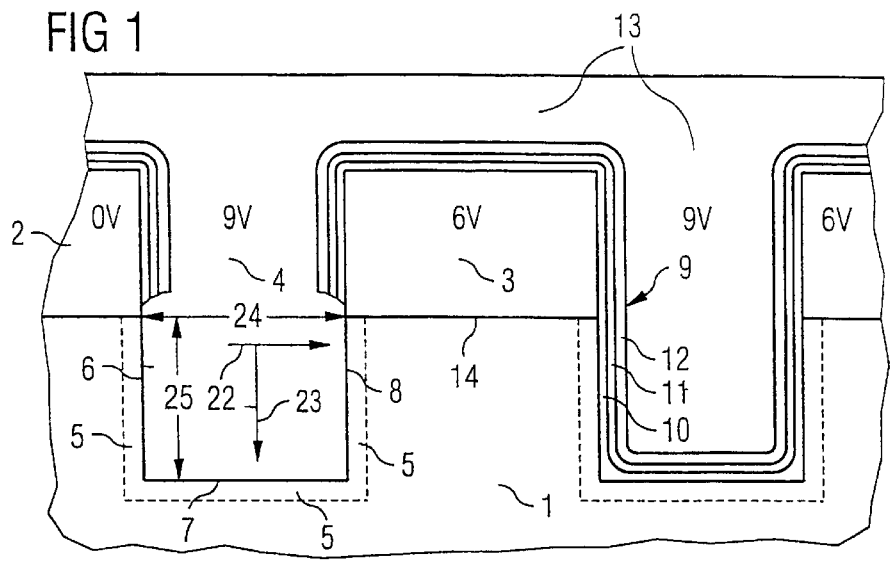
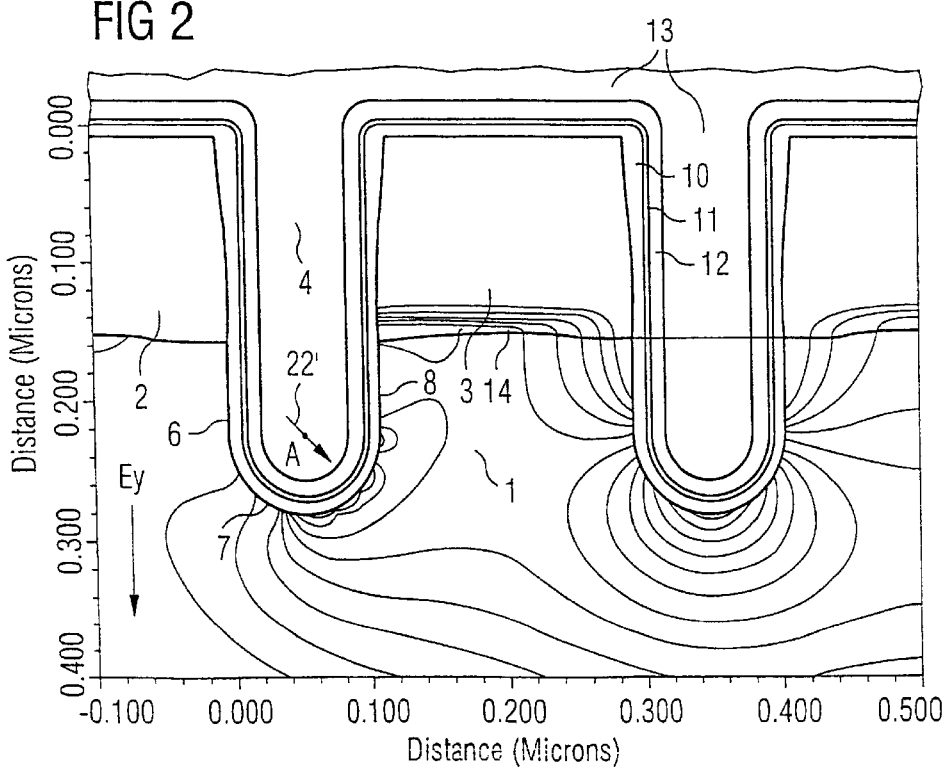

MEMORY CELL WITH TRENCH TRANSISTOR

BACKGROUND OF THE INVENTION

1. Field of the Invention

The present invention relates to a memory cell with a storage transistor comprising a gate electrode at a top surface of a semiconductor body or semiconductor layer, which electrode is disposed between a source zone and a drain zone in a trench that is constructed in the semiconductor material of the semiconductor body or layer and that exhibits identical cross-sections transverse to a longitudinal direction, at least section by section, whereby a dielectric layer, preferably an ONO layer, is provided as the storage medium between the gate electrode and the semiconductor material.

2. Description of the Related Art

DE 100 39 441 A1 teaches a memory cell with a trench transistor which is disposed in a trench constructed at a top surface of a semiconductor body. Arranged between the gate electrode which is installed in the trench, the laterally adjoining source zone, and the adjoining drain zone on the other side is an oxide-nitride-oxide layer sequence, which is provided for trapping charge carriers at the source and drain. Such transistors are particularly well suited to NVM (Non-Volatile Memory) memory cell arrangements. The regions which exhibit the required electrical field intensities for programming and erasing are generally located in different positions in these transistors. As a consequence, once charges have been programmed on the nitride, it is difficult to completely erase them. An injection of electrons is required for the programming operation. The electrons must penetrate through the oxide boundary layer in order to reach the nitride layer which is provided as the storage layer. For this reason, the electrons must have a high kinetic energy, being what are known as hot electrons. Such electrons are present only where the electrical field intensity is very strong in the channel under the gate electrode at the surface of the semiconductor material.

The enclosed FIG. 5 is a diagram representing the gate electrode 4, the gate dielectric 9 (which can be an ONO storage layer, in particular), and the adjoining semiconductor material with the channel region 5, from left to right. In the vertical direction, denoted by an arrow, the energy is plotted, which increases in the direction of the arrow. The plotted curves a and b indicate the upper limit of the valence band and the lower limit of the conduction band, respectively. There are two Fermi energy levels $E_{f1}$ and $E_{f2}$. Up to these energy levels, the states, which can only be singly occupied according to the Pauli principle, are full of electrons. When the Fermi energy level $E_{f1}$ is lower, only a few electrons are located in the conduction band at the boundary of the semiconductor material, as indicated by the hatched region in FIG. 5. It can be recognized that in the case of a higher Fermi energy level $E_{f2}$, more electrons, and furthermore higher-energy electrons, are present in the conduction band. Therefore, for the higher-energy electrons it is easier to tunnel through the oxide layer bordering the nitride storage layer.

FIG. 6 represents a cross-section of a typical transistor structure including a source zone 2, a drain zone 3, a gate electrode 4, a gate dielectric 9 and the channel region 5. The dashed line represents the boundary of a developing space charge zone of the channel. Upon application of the provided voltages which are required for programming such a transistor, the electrons are accelerated through the channel region in the direction of the arrows. The length of the arrows (which is not true to scale) indicates the average kinetic energy of the electrons. It is clear that the average kinetic energy of the electrons increases sharply proceeding toward the drain zone 3. This increase is extremely overproportional, because the electrical field intensity increases sharply proceeding toward the drain zone 3 until a point just before the drain zone. When the electrons reach the end of the channel region 5, their energy is high enough that they can get into the storage layer.

In the case of a storage transistor that is disposed in a trench, the region in which the electrons have a suitable energy for programming is likewise located at the end of the channel region, which ends in this case on one side of the trench bottom directly below the junction of the p-conductive doped substrate into the $n^+$-conductive doped drain region. In a cross-section with the source zone on the left and the drain zone on the right, this region of favorable programming is situated at the bottom of the trench approximately on the bottom right-hand side.

For the erase operation, an injection of holes (charge carriers with the opposite sign) are needed, which can be obtained in an n-MOSFET only by the GIDL (Gate Induced Drain Leakage) effect. This effect occurs only in the vicinity of the drain zone. The locations at which the electron injection and the hole injection occur are thus not necessarily identical. In any case, this type of memory cell can be erased with a high applied voltage and/or very long erase times.

SUMMARY OF THE INVENTION

It is the object of the present invention to construct a memory cell with a trench transistor in which the program and erase times are significantly shorter than in conventional memory cells of this type.

This object is achieved with the memory cell with the features of the independent claims. Other developments are recited in the dependent claims.

According to the invention, the depth of the trench with respect to a region in which charge carriers of the storage layer are neutralized in an erase operation is selected such that in a programming operation a component of an electrical field acting on the charge carriers, which component is aligned parallel to the tangents to a wall or to the bottom of the trench and perpendicular to the longitudinal direction of the trench, is at a maximum in the same region. This way, the trench depth is optimized in such a way that the locations for electron and hole injections coincide. The junctions in which the doping of the source zone and drain zone changes to the opposite sign, i.e. the sign of the conductivity type of the substrate or semiconductor body, abut a curved region of the trench bottom or a curved lower region of the lateral trench walls.

A more precise description of the memory cell follows, with reference to FIGS. 1 to 6.

BRIEF DESCRIPTION OF THE DRAWING

FIG. 1: a schematic cross-section through two adjoining trenches.

FIG. 2: the cross-section represented in FIG. 1 for two trenches which are simulated with the aid of a model, with a curve of the downward E-field-component.

Figure 3:
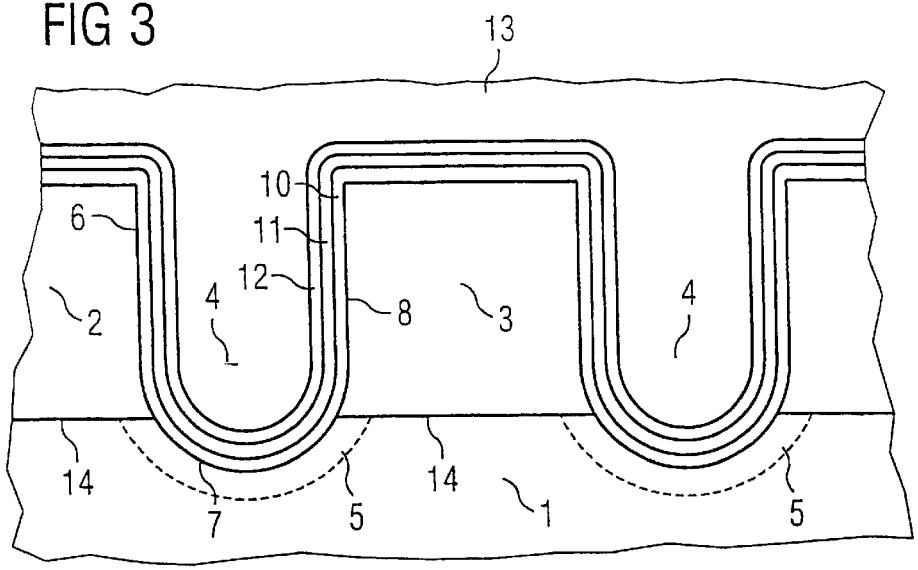
FIGS. 3 and 4: corresponding cross-sections of inventively constructed memory cells.

DESCRIPTION OF THE PREFERRED EMBODIMENTS:

FIG. 1 represents a cross-section of two trenches which are produced in a semiconductor body 1 serving as the substrate or in a semiconductor layer on a substrate. At least section by section, the cross-sections of the trenches in the longitudinal direction of the trenches are identical. Thus, the representation of FIG. 1 would look the same for the section in front of the plane of projection and the section behind the plane of projection. In the specification and claims, the longitudinal direction refers to the direction along which a vertical section does not vary.

In a region on the relevant top surface of the semiconductor body 1 or semiconductor layer, a source zone 2 and a drain zone 3 (here as an example for the left-hand trench transistor) are formed by incorporating a dopant. The semiconductor body 1 is doped p-conductive, for instance; the source zone 2 and drain zone 3 are then formed $n^+$-conductive, accordingly. The boundaries between the regions of opposite doping, which are typically clearly expressed, are hereinafter referred to as junctions 14; their position in the semiconductor material is detectable (e.g. with SIMS). A gate electrode 4, for instance a polysilicon electrode, is installed in each of the trenches. A channel region 5 develops under the source and drain zones opposite the gate electrode at the boundary surface of the semiconductor material.

The sidewalls 6, 8 and the bottom 7 of the trench refer to the surface of the semiconductor material facing the trench. Located between the gate electrode 4 and the semiconductor material is a dielectric layer 9, which serves as the gate dielectric and which covers the walls and the bottom of the trench. This dielectric layer 9 is formed as the storage medium. To accomplish this, the dielectric layer 9 is preferably multilayered, including at least one storage layer 11, which is disposed between boundary layers 10, 12 in the present example of FIG. 1. The boundary layers 10, 12 are oxide (specifically silicon dioxide here), whereas the storage layer 11 can be nitride (here $Si_3N_4$).

For instance, in the operation of the memory cell, for programming there is a voltage of 0V at the source region, a voltage of 9V at the gate electrode 4, and a voltage of 6V at the drain region 3; for erasing there is a voltage of −8V at the gate electrode and a voltage of 5V at the drain region. In the drawing, the dielectric layer 9 in the bottom of the trench has been omitted from the trench of the memory cell on the left, this being indicated by corresponding dotted lines. In order to aid the following description, a horizontal arrow 22 and a vertical arrow 23 are included in the drawing, which indicate the lateral direction from source to drain, and the vertical direction into the trench depth, respectively. Besides these, the spacing 24 between the walls of the trench at the height of the junctions 14 and the depth 25 of the trench below the height of the junctions 14 (i.e. the overall vertical dimension of the trench from a junction 14 to the deepest point of the trench) are also included in the Fig.

The electrical voltage is applied to the source zones 2 and drain zones 3 via contacts attached thereto in front and back of the plane of projection, respectively, whereas the gate voltage is supplied via the word line 13 extending transversely, i.e. in the plane of projection. In the programming operation, the given voltage values for a trench with a bottom in the shape of the shell of a semicylinder yield a distribution of electrical field intensities whose component in the represented cross-sectional plane tangential to the bottom or tangential to the wall of the trench is at a maximum on the right-hand side under the junction.

These relations are reproduced in FIG. 2, which represents the cross-section that is schematically represented in FIG. 1 for model calculation for trenches with semicylindrical bottoms. The curves represent the lines of the cross-section on which the component $E_\gamma$ of the electrical field, which is indicated by the arrow, has the same value, respectively. Certain inferences can be drawn from this as to the magnitude of the absolute value of that component of the electrical field which extends within this cross-section tangential to the trench wall or bottom, respectively.

It can be clearly seen that in the left-hand memory cell, which in FIG. 1 has been precharged for programming with the corresponding voltages, a maximum of the field component which extends in the longitudinal direction of the channel approximately in the direction of arrow 22 given downward rotation of 30° occurs when this arrow (now 22') points through the axis A of the semicylinder forming the bottom. At this point, the efficient programming of the memory cell takes place, whereas the hole injection in the erase operation takes place in the region directly above the junction 14 of the drain zone 3.

FIG. 3 represents an inventively optimized memory cell of this type in which the relevant region of the curved bottom of the trench is disposed near the pn junction between the drain zone 3 and the oppositely doped semiconductor material. The precise dimensions of the memory cell so optimized can be discovered for a respective exemplifying embodiment without fundamental difficulties with the aid of model computations and simulations which are common to the person skilled in the art and/or experimentally with the aid of realized structural elements. But it is not possible to give corresponding numerical data for all the embodiments which fall within the scope of the invention. Therefore, it will now be explained in detail what constitutes the principle of the invention. The technical teaching will be laid out in the context of what is required in order to place the person skilled in the art in a position to fabricate a memory cell of this type.

Of primary importance is the recognition that it is not the channel length alone, but rather essentially the type of curvature of the trench bottom and lower region of the lateral trench walls which determines the curve of the field component which is aligned tangential to the trench wall. Contrary to the assumption hitherto that the trench must be installed deep enough into the semiconductor material that a substantial portion of the wall of the trench is located under the regions of the source and drain, in the inventive memory cell it is provided that a lateral curve is situated between the actual bottom and the essentially vertical lateral wall of the trench in the region in which the hole injection takes place in the erase operation. The regions which are provided for programming and erasing by charge carrier injection are thus brought into alignment directly over the pn-junction. To accomplish this, the trench depth is reduced accordingly.

This is represented in the cross-section in FIG. 3, in which the reference characters have the same meaning as in the foregoing Figs. The vertical dimension of the source zone 2 and the drain zone 3 between the top surface of the semiconductor body 1 or semiconductor layer and the junction 14 between the source zone 2 or drain zone 3 and the oppositely doped semiconductor material, (which, however, need not form a flat surface in practice, but rather can be constructed somewhat irregular), is only slightly smaller in the memory cell than the total vertical dimension of the trench. In the determination of the position of the junction by means of SIMS, the average over a certain area is taken.

The vertical dimension of the trench has a downward overhang beyond the junctions 14, which is referred to hereinafter as the depth 25 of the trench. This is measured from the level of the junctions 14 in the trench to the deepest point of the trench bottom (relative to the plane of the top main surface of the semiconductor body or semiconductor layer) in the vertical direction, i.e. perpendicularly relative to the plane of the top surface of the semiconductor body or layer.

In preferred exemplifying embodiments, this depth 25 is at most half as large as the spacing 24 of the walls of the trench (the trench width) at the height of the junctions 14. The depth 25 is so selected in dependence upon the relevant geometric shape of the trench cross-section that the junctions 14 respectively touch the walls of the trench in a region wherein the curve of the wall of the trench in a cross-section transverse to the longitudinal direction has a curve radius which is at most two-thirds as large as the spacing 24 of the walls of the trench at the height of the junctions 14.

When the bottom of the trench has the shape of the shell of a semicylinder with radius r, the spacing 24 of the walls of the trench at the height of junctions 14 is at most twice as large as this radius, namely 2r at most. The curve radius of the trench bottom is r throughout this example; accordingly, the maximum depth 25 is expediently equal to r, though it is preferably somewhat smaller.

In case the radius r of said semicylinder is 55 nm, for instance, the depth is 55 nm or somewhat smaller. Because the channel length should not be too small, a value of 30 nm can be prescribed as the lower limit for the depth 25, to be maintained as far as possible. Given this depth 25 of 30 nm, the arc of the trench bottom, which is visible in the cross-section below the junctions 14 and which approximately represents the length of the channel, equals 120.88 nm for the given radius r of 55 nm, and 134.76 nm for a radius r of 70 nm; the spacing 24 of the walls of the trench at the height of the junctions 14 equals 97.98 nm for r=55 nm, and 114.89 nm for r=70 nm; thus, in either case the curve radius at the point at which the junctions 14 abut the walls of the trench equals less than two-thirds of the spacing 24 of the walls of the trench at the height of the junctions 14.

When the vertical dimension of the source zone 2 and the drain zone 3 is 150 nm, for example, the optimal overall trench depth as measured from the top surface of the semiconductor body or layer is in the range from 180 nm to 205 nm for a radius r of 55 nm and in the range from 180 nm to 220 nm for a radius r of 70 nm. In this example, the bottom of the trench need not have the shape of the shell of a whole semicylinder; the lateral trench walls can already connect to the curved bottom directly or at a slight remove over the junctions, so that only the shell of a segment of a semicylinder is present at the bottom—that is to say, the shell of a cylinder sector with a central angle of less than 180°.

The trench depth must be adapted to other curve radii of the trench bottom or other shapes of the trench bottom accordingly. The level of dopant concentrations also plays a role, and it may be necessary to consider additional implantation of the channel region 5. An implantation for purposes of elevating the conductivity of the channel and reducing the electrical field at the points of sharper trench curvature makes it possible also to provide a somewhat sharper curve in the regions of the trench bottom in which a charge carrier injection into the storage layer will not take place. It is thus within the scope of the invention to provide a somewhat tapered trench bottom and an implantation of dopant into the underlying semiconductor material in the region of the deepest point of the bottom. It can be advantageous herein to provide a larger channel length by selecting the depth 25 larger than half the trench wall spacing 24 at the height of the junctions 14. However, in this example as well, in the cross-section perpendicular to the longitudinal direction of the trench the curve of the wall where the junctions 14 abut the trench walls has a radius of at most two-thirds of the spacing 24.

In some embodiments it may be advantageous when the depth 25 of the trench is significantly less than half the spacing 24 of the walls of the trench at the height of the junctions 14, particularly when the trench has a bottom with a less curved or flat inner portion and sharply curved lateral portions, and the predominating portions of the walls extend at least approximately vertically, so that a substantial curvature is present only at the lower sides of the bottom. Nevertheless, in these embodiments it must be taken into consideration that the channel length may not suffice given a very small depth 25 and a very flat trench bottom, or part of the inventively intended optimization may be offset owing to the small channel length.

Figure 4:
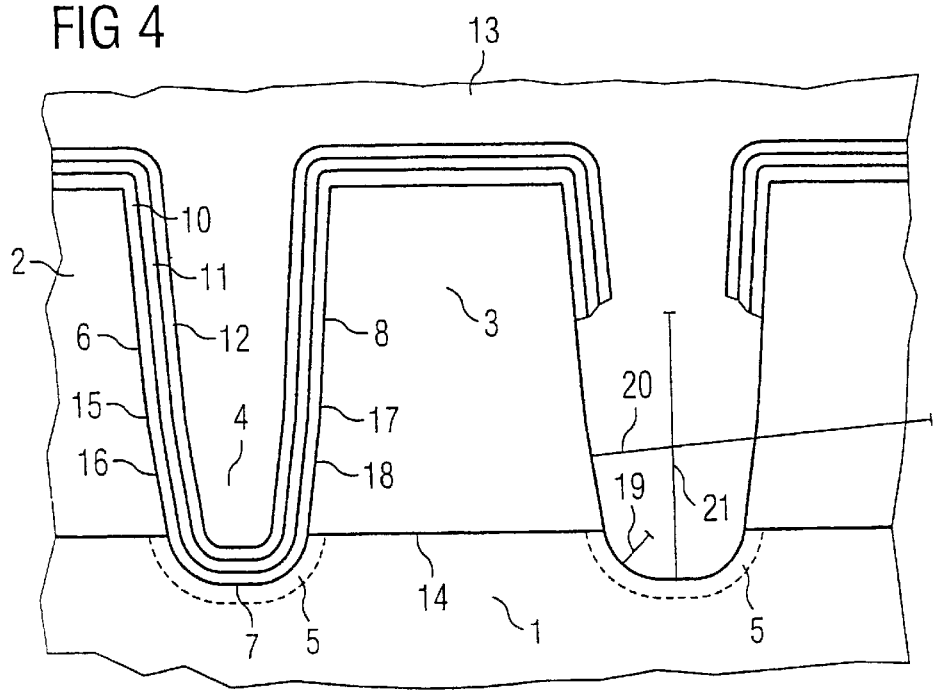
Figure 5:
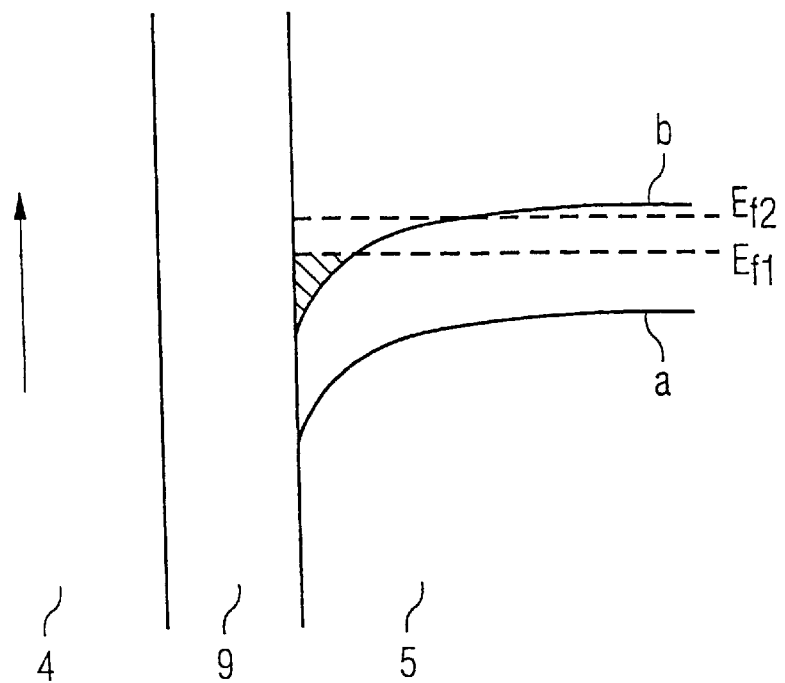
FIGS. 5 and 6: the representations described in the introduction to the specification.
Figure 6:
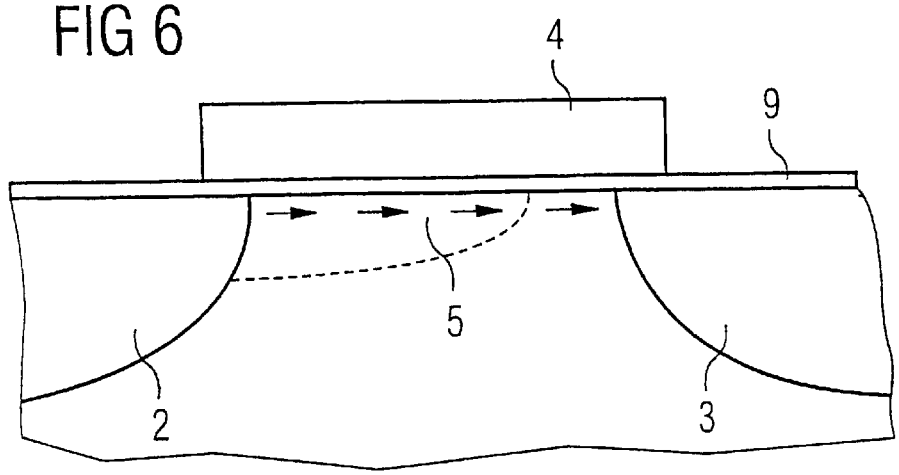

The lateral walls of the trenches can be inclined to vertical (arrow 23 in FIG. 1) in their upper region. FIG. 4 represents a corresponding cross-section of an additional exemplifying embodiment wherein the lateral walls of the trenches are clearly oblique in their upper regions, having an angle of inclination of some 5° to vertical. In this exemplifying embodiment, the lateral walls 6, 8 have narrow regions 15, 17 just above the trench bottom 7 extending in the longitudinal direction of the trenches, in which regions the direction of the lateral walls within the cross-section bends slightly. In the lower regions 16, 18 of the lateral walls the direction of the tangents to the walls within the cross-section is in the larger angle ranges up to 10° to vertical. The bottom 7 of the trench is curved relatively slightly here, so that regions of significantly sharper curvature of the trench wall are located between the lower regions 16, 18 of the side walls and the bottom 7 of the trench.

In this exemplifying embodiment, the depth 25 of the trench is selected such that the pn-junction (junction 14) between the source zone and the oppositely doped semiconductor material, or between the drain zone and the oppositely doped semiconductor material, is disposed approximately at the height of this sharp curve or just above it. It can also be assumed herein that the programming takes place in the region of the trench wall just above the region with the sharpest curvature.

For purposes of illustration, the dielectric layer 9 in the lower region has been omitted from the cross-section of the right-hand trench in FIG. 4, which is also indicated by dotted lines. Curve radii 19, 20 and 21 are included, which are not true to scale or drawn with precision. The lengths are merely intended to illustrate that the curve radius 19 is very small in the regions which are provided to the side of the actual bottom. The adjoining regions 16, 18 of the lateral walls have a substantially larger curve radius 20. The curve radius 21 of the bottom 7 is likewise relatively large.

Looking at the tangents to the trench wall which extend in the plane of projection transverse to the longitudinal direction of the trench, the portion of the wall which is formed by lateral walls can be defined by the relatively small angle of inclination of at most 10° to vertical (arrow 23). In the trenches of the embodiment according to FIG. 4, there are portions of the wall of the trench located between these lateral walls and a deepest point of the bottom which have a curve radius within the cross-section of FIG. 4 (which is perpendicular to the longitudinal direction) which is, at every point, at most half as large as the spacing 24 of the walls of the trench at the height of the junctions 14. The junctions 14 abut the lateral walls of the trenches in these regions.

Presumably, the region in which the hole injection takes place during the erase operation at least approximately coincides with the region with the sharpest curvature of the wall of the trench, respectively. Thus, it can be advantageous when the junctions 14 abut the lateral trench walls in a region in which the curve radius is at most 10% larger than the smallest value it assumes at the trench wall.

The memory cell preferably has the mirror-symmetrical construction represented in the Figs., because in this case, when the applied voltages are reversed, programming and erasing can also occur in the region of the storage layer located on the left side of the Figs.

What is claimed is:

1. A memory cell with a storage transistor, comprising:
   a semiconductor body having a top surface, a source zone doped from said top surface, a drain zone doped from said top surface, and a trench formed therein between said source zone and said drain zone and having walls, said trench being formed along a longitudinal direction;
   a junction of said source zone being defined beneath said source zone and intersecting a region of a respective one of said walls of said trench;
   a junction of said drain zone being defined beneath said drain zone and intersecting region of a respective one of said walls of said trench;
   a gate electrode on aid top surface of said semiconductor body being disposed in said trench;
   a dielectric layer isolating said gate electrode from said semiconductor body an acting as a storage medium; and
   a spacing being defined across said trench between said junctions;
   said regions of said walls being located where said walls have a cross section transverse to said longitudinal direction with a curve radius equaling at most two-thirds of said spacing.

2. The memory cell according to claim 1, wherein said trench has identical cross-sections transverse to said longitudinal direction.

3. The memory cell according to claim 1, wherein:
   said walls of said trench are laterally spaced relative to said longitudinal direction, are substantially vertical and perpendicular to said top surface of said semiconductor body, and deviate from perpendicular no more than ten degrees; and
   said curve radius is no larger than half said spacing.

4. The memory cell according to claim 1, wherein:
   said trench has a curved bottom shaped like a shell of a semicylinder; and
   said junctions abut said curved bottom.

5. The memory cell according to claim 1, wherein:
   said trench has a curved bottom shaped like a shell of a cylinder sector; and
   said junctions abut said curved bottom.

6. The memory cell according to claim 1, wherein:
   said spacing is between 100 nm and 150 nm; and
   a depth of said junctions is at least 30 nm and at most half of said spacing.

7. A memory cell with a storage transistor, comprising:
   a semiconductor body having a top surface and a trench formed therein with walls joined by a curved bottom having a lowest point;
   a source zone in said semiconductor body doped from said top surface;
   a junction of said source zone beneath said source zone;
   a drain zone in said semiconductor body doped from said top surface;
   a junction of said drain zone beneath said drain zone;
   a gate electrode on said top surface of said semiconductor body being disposed between said source zone and said drain zone in said trench;
   a dielectric layer isolating said gate electrode from said semiconductor body an acting as a storage medium;
   said junctions intersecting a respective one of said walls at a height from said lowest point;
   a spacing being defined between said junctions across said trench; and
   said height being no larger than one half said spacing.

8. The memory cell according to claim 7, wherein said curved bottom has a curve radius throughout being no larger than two-thirds said spacing.

9. The memory cell according to claim 7, wherein:
   said trench has a longitudinal direction; and
   identical cross-sections transverse to said longitudinal direction.

10. The memory cell according to claim 8, wherein:
    said curved bottom of said trench is shaped like a shell of a semicylinder; and
    said junctions abut said curved bottom.

11. The memory cell according to claim 8, wherein:
    said curved bottom of aid trench is shaped like a cylinder sector of a semicylinder; and
    said junctions abut said curved bottom.

12. The memory cell according to claim 7, wherein;
    said spacing is between 100 nm and 150 nm; and
    a depth of said trench is least 30 nm and at most half of said spacing.

13. A memory cell with a storage transistor, comprising:
    a semiconductor body having a top surface and a trench formed therein having walls joined by a curved bottom, said curved bottom having a minimum radius;
    a source zone in said semiconductor body doped from said top surface;
    a junction of said source zone beneath said source zone;
    a drain zone in said semiconductor body doped from said top surface;
    a junction of said drain zone beneath said drain zone;
    a gate electrode on said top surface of said semiconductor body being disposed between said source zone and said drain zone in said trench;
    a dielectric layer isolating said gate electrode from said semiconductor body and acting as a storage medium;
    each of said junctions intersecting a respective one of said walls at a respective depth; and
    each of said walls having a respective curve radius at each respective depth of said junctions being at most ten percent larger than said minimum radius of said curved bottom.

14. The memory cell according to claim 13, wherein:
said trench has a longitudinal direction; and
identical cross-sections transverse to said longitudinal direction.

15. A memory cell with a storage transistor, comprising
a semiconductor body having a top surface and a trench formed therein having walls joined by a curved bottom, said trench having a longitudinal direction;
a source zone in said semiconductor body doped from said top surface;
a junction of said source zone beneath said source zone;
a drain zone in said semiconductor body doped from said top surface;
a junction of said drain zone beneath said drain zone;
a gate electrode on aid top surface of said semiconductor body being disposed between said source zone and said drain zone in said trench;
a dielectric layer isolating said gate electrode from said semiconductor body and including boundary layers and a storage layer for holding charge carriers separating said boundary layers; and
a region of said storage layer being neutralized during an erase operation by a electrical field having a component aligned parallel to tangent of at least one of said walls and said bottom and perpendicular to the longitudinal direction;
each of said junctions intersecting a respective one of said walls at a respective depth from said bottom; and
said depth of said trench being set to maximize the component of the electric field at said region.

16. The memory cell according to claim 15 wherein:
said trench has at least one section along said longitudinal direction; and
identical cross-sections transverse to said longitudinal direction.

17. The memory cell according to claim 15, including a further region of said boundary layer adjoining said drain zone between said top surface and said junction of said drain zone, said trench having a depth dimensioned to permit charge carriers to penetrate said further region of said boundary layers during program and erase operations.

18. The memory cell according to claim 1, wherein a curve radius throughout each of said regions of said wall located where said walls have a cross section transverse to said longitudinal direction equals at most two-thirds of said spacing.

* * * * *